US011264463B2

(12) United States Patent
Bouche et al.

(10) Patent No.: US 11,264,463 B2
(45) Date of Patent: *Mar. 1, 2022

(54) MULTIPLE FIN FINFET WITH LOW-RESISTANCE GATE STRUCTURE

(71) Applicant: GLOBALFOUNDRIES INC., Grand Cayman (KY)

(72) Inventors: Guillaume Bouche, Albany, NY (US); Andy Chih-Hung Wei, Queensbury, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 16/883,492

(22) Filed: May 26, 2020

(65) Prior Publication Data

US 2020/0286998 A1    Sep. 10, 2020

Related U.S. Application Data

(63) Continuation of application No. 14/264,240, filed on Apr. 29, 2014, now Pat. No. 10,700,170.

(51) Int. Cl.
| *H01L 29/161* | (2006.01) |
| *H01L 29/16* | (2006.01) |
| *H01L 23/482* | (2006.01) |
| *H01L 29/417* | (2006.01) |
| *H01L 29/66* | (2006.01) |
| *H01L 29/78* | (2006.01) |

(52) U.S. Cl.
CPC ........ *H01L 29/161* (2013.01); *H01L 23/4824* (2013.01); *H01L 29/16* (2013.01); *H01L 29/41791* (2013.01); *H01L 29/66795* (2013.01); *H01L 29/785* (2013.01); *H01L 2924/0002* (2013.01)

(58) Field of Classification Search
CPC ........................ H01L 29/785; H01L 29/66795
See application file for complete search history.

(56) References Cited

U.S. PATENT DOCUMENTS

| 6,475,869 B1 | 11/2002 | Yu |
| 8,994,116 B2 | 3/2015 | Gan et al. |
| 2007/0221956 A1* | 9/2007 | Inaba .............. H01L 21/823878 257/197 |
| 2008/0251849 A1* | 10/2008 | Yamagami .......... H01L 29/6681 257/368 |

(Continued)

OTHER PUBLICATIONS

Office Action dated Jun. 22, 2018 issued in co-pending Chinese Application No. 201510208212.3.

(Continued)

*Primary Examiner* — Samuel A Gebremariam
*Assistant Examiner* — Jonas T Beardsley
(74) *Attorney, Agent, or Firm* — Williams Morgan, P.C.

(57) ABSTRACT

Embodiments of the present invention provide a multiple fin field effect transistor (finFET) with low-resistance gate structure. A metallization line is formed in parallel with the gate, and multiple contacts are formed over the fins which connect the metallization line to the gate. The metallization line provides reduced gate resistance, which allows fewer transistors to be used for providing In-Out (IO) functionality, thereby providing space savings that enable an increase in circuit density.

19 Claims, 3 Drawing Sheets

(56) References Cited

U.S. PATENT DOCUMENTS

| | | | |
|---|---|---|---|
| 2008/0258228 A1 | 10/2008 | Chuang et al. | |
| 2009/0309152 A1 | 12/2009 | Knoefler | |
| 2011/0147839 A1 | 6/2011 | Yagishita et al. | |
| 2012/0001266 A1 | 1/2012 | Lim et al. | |
| 2012/0319211 A1 | 12/2012 | van Dal et al. | |
| 2013/0026571 A1* | 1/2013 | Kawa | G06F 30/394 257/347 |
| 2013/0093026 A1 | 4/2013 | Wann et al. | |
| 2013/0154011 A1* | 6/2013 | Jou | H01L 29/66795 257/368 |
| 2013/0228876 A1* | 9/2013 | Mor | H01L 29/7848 257/401 |
| 2013/0288443 A1 | 10/2013 | Jou et al. | |
| 2013/0307032 A1* | 11/2013 | Kamineni | H01L 21/76849 257/288 |
| 2014/0077305 A1 | 3/2014 | Pethe et al. | |

OTHER PUBLICATIONS

Office Action dated Jun. 29, 2015 issued in co-pending U.S. Appl. No. 14/264,240.
Office Action dated Feb. 4, 2016 issued in co-pending U.S. Appl. No. 14/264,240.
Final Office Action dated Nov. 30, 2018 issued in co-pending U.S. Appl. No. 14/264,240.
Office Action dated Nov. 19, 2019 issued in co-pending U.S. Appl. No. 14/264,240.

* cited by examiner

MULTIPLE FIN FINFET WITH LOW-RESISTANCE GATE STRUCTURE

FIELD OF THE INVENTION

The present invention relates generally to semiconductor fabrication, and more particularly, to transistors with low-resistance gate structures.

BACKGROUND

As technology progresses, the manufacture of electronic devices must be improved to meet the trend of mobile, lightweight, and efficient electronic devices. However, as devices scale, certain functions such as In-Out (IO) functionality become challenging. The IO functionality may handle signals and power from a functional circuit, providing a connection to external circuitry, for example. The current requirements of IO functionality make scaling of certain devices difficult due to increased gate resistance as devices scale. It is therefore desirable to have improvements in finFETs to address the aforementioned challenges.

SUMMARY

Embodiments of the present invention provide a multiple fin field effect transistor (finFET) with low-resistance gate structure. A metallization line is formed in parallel with the gate, and multiple contacts are formed over the fins which connect the metallization line to the gate. The metallization line provides reduced gate resistance, which allows fewer transistors to be used for providing In-Out (IO) functionality, thereby providing space savings that enable an increase in circuit density.

In a first aspect, some embodiments of the invention provide a semiconductor structure, comprising: a semiconductor substrate; a plurality of fins formed in the semiconductor substrate; a gate disposed over the plurality of fins; a plurality of contacts in direct physical contact with the gate and directly over the plurality of fins; and a metallization line disposed over the plurality of contacts, wherein the metallization line is in electrical contact with the plurality of contacts.

In a second aspect, some embodiments of the present invention provide a semiconductor integrated circuit, comprising: a plurality of In-Out (IO) circuits, wherein each IO circuit comprises at least one finFET device, wherein the at least one finFET device comprises a gate having a length/width aspect ratio ranging from 16 to 60.

In a third aspect, embodiments of the present invention provide a semiconductor structure, comprising: a semiconductor substrate; a plurality of fins formed in the semiconductor substrate; a gate disposed over the plurality of fins, wherein the plurality of fins comprises between 40 fins and 100 fins; a plurality of contacts in direct physical contact with the gate and directly over the plurality of fins, wherein a fins per contact parameter ranges from 5 fins to 20 fins; and a metallization line disposed over the plurality of contacts, wherein the metallization line is in electrical contact with the plurality of contacts.

BRIEF DESCRIPTION OF THE DRAWINGS

The accompanying drawings, which are incorporated in and constitute a part of this specification, illustrate several embodiments of the present teachings and together with the description serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

DETAILED DESCRIPTION

Figure 1:
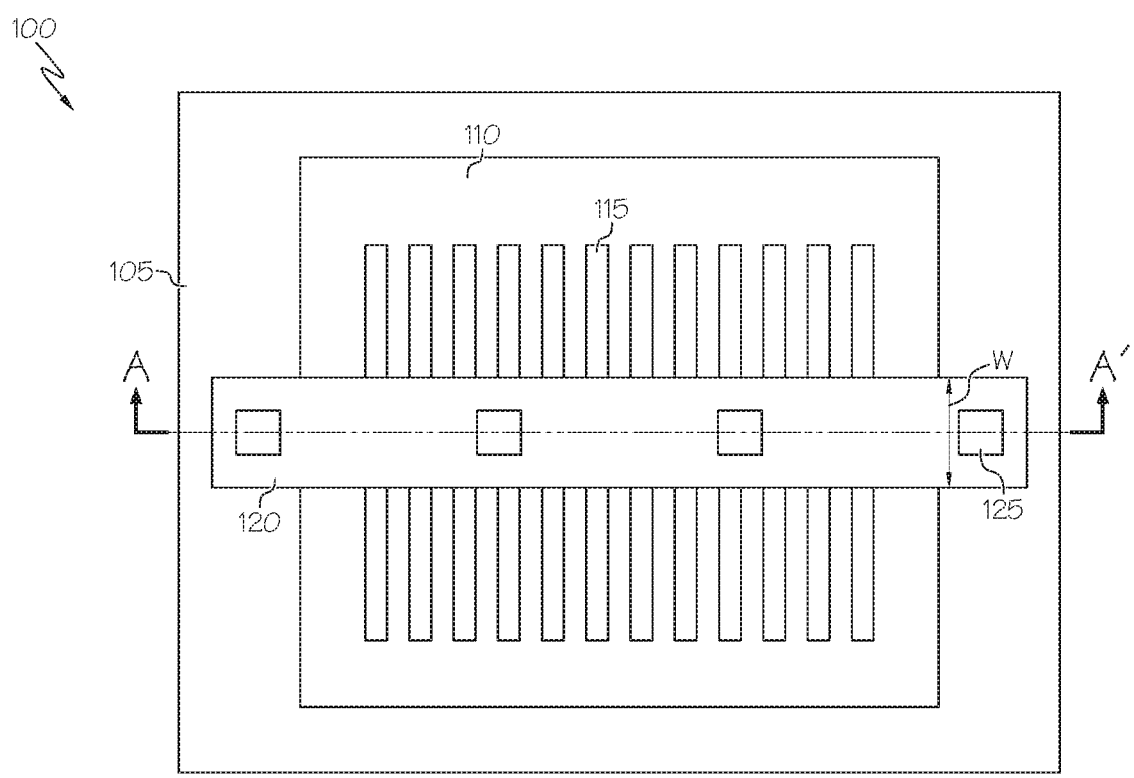
FIG. 1 shows a top-down view of a semiconductor structure in accordance with embodiments of the present invention.

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments of the present invention provide a multiple fin field effect transistor (finFET) with low-resistance gate structure. A metallization line is formed in parallel with the gate, and multiple contacts are formed over the fins which connect the metallization line to the gate. The metallization line provides reduced gate resistance, which allows fewer transistors to be used for providing In-Out (IO) functionality, thereby providing space savings that enable an increase in circuit density.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", are used interchangeably herein, when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments", "in some embodiments", and similar language throughout this specification may, but do not necessarily, all refer to the same embodiment.

The terms "overlying" or "atop", "positioned on, "positioned atop", or "disposed on", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

FIG. 1 shows a top-down view of a semiconductor structure in accordance with embodiments of the present invention. Semiconductor structure 100 includes a STI region 105 having a fin merge semiconductor region 110, which may be epitaxial silicon or silicon germanium (SiGe). A plurality of fins 115 are formed in the semiconductor substrate (i.e., on the fin merge region 110). In some embodiments, the plurality of fins 115 ranges from 20 fins to 30 fins. In some embodiments, the plurality of fins 115 ranges from 31 fins to 60 fins. In some embodiments, the plurality of fins 115 ranges from 61 fins to 200 fins. The fins may be silicon or SiGe, and may be formed by sidewall image transfer (SIT) or any other suitable process. A gate 120 is formed over the fins 115. The gate 120 may be tungsten, aluminum, or any other suitable material or combination thereof. The gate may be formed by a replacement metal gate process or any other suitable method. Gate 120 has a width W. In some embodiments, W ranges from about 20 nanometers to about 30 nanometers. Gate 120 has a length L. In some embodiments, L ranges from about 480 nanometers to about 1200 nanometers. Hence, in some embodiments, the length/width aspect ratio ranges from 16 to 60. A plurality of contacts 125 are disposed in direct physical contact with the gate 120 and directly over the plurality of fins 115. Contacts 125 may be tungsten, aluminum, copper, any other suitable conductor, or any combination thereof. A metallization line (not shown) is disposed over, and in electrical contact with, the plurality of contacts 125. Metallization line may be copper, tungsten, aluminum, any other suitable conductor, or any combination thereof. Reduced equivalent gate resistance is achieved by putting the metallization line in parallel with the gate (rather than trying to engineer a better gate material, which is very difficult). This way, voltage drop along extended gate lines is prevented. This arrangement also saves space, allowing a reduction in amount of space required for I/O devices, thus enabling a greater number of devices on a chip (increased circuit density). The increased space savings is achieved because instead of requiring multiple transistors to address the issue of gate resistance, a single transistor with reduced gate resistance is used.

Figure 2:
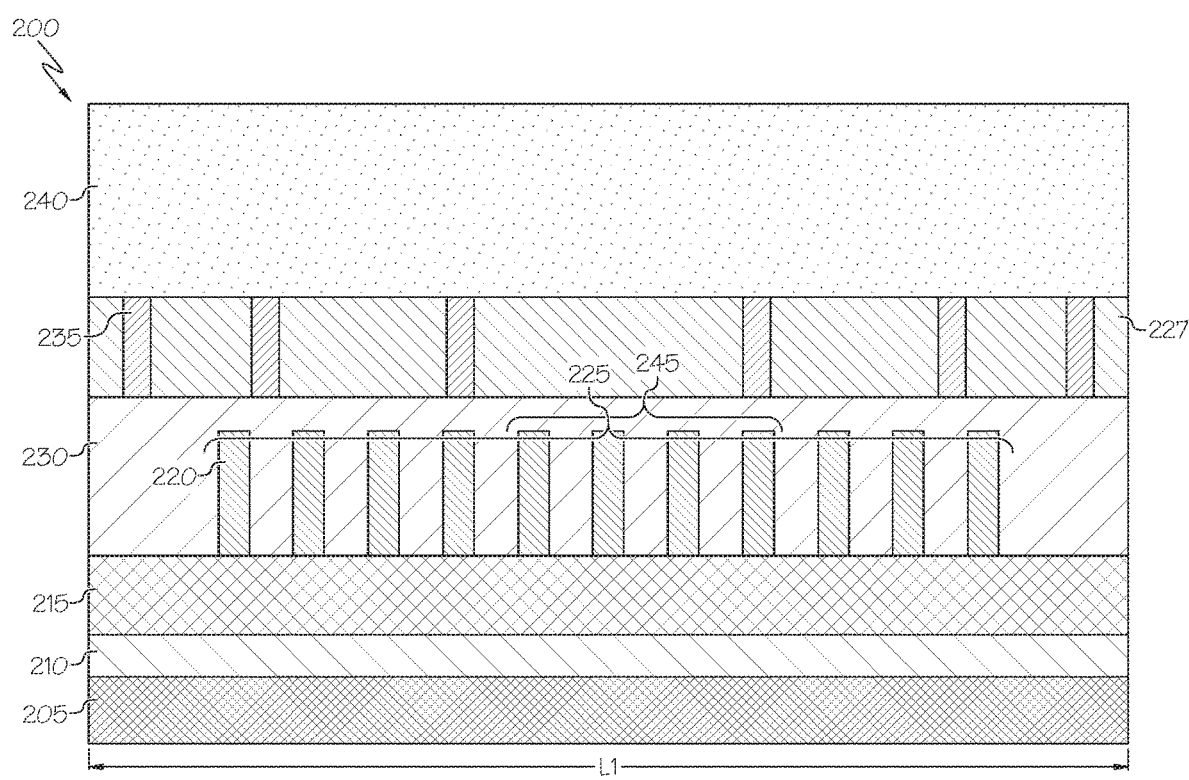
FIG. 2 shows a cross-sectional view of a semiconductor structure in accordance with embodiments of the present invention.

FIG. 2 shows a cross-sectional view of a semiconductor structure in accordance with embodiments of the present invention. This view is similar, although not identical, to a cross-section of FIG. 1 along A-A'. Semiconductor structure 200 comprises a bulk semiconductor substrate 205. An insulator layer 210 is disposed on the bulk semiconductor substrate. A semiconductor-on-insulator substrate 215 is disposed on the insulator layer 210. A plurality of fins 220 are formed denoting a fin region 225 in the semiconductor-on-insulator substrate 215. In some embodiments, the plurality of fins 220 ranges from 20 fins to 30 fins. In some embodiments, the plurality of fins 220 ranges from 31 fins to 60 fins. In some embodiments, the plurality of fins 220 ranges from 61 fins to 200 fins. A gate 230 may be disposed over the plurality of fins 220. A dielectric layer 227 is disposed between the gate 230 and a metallization line 240. In embodiments, the dielectric layer may comprise silicon oxide, SiOC, SiCON, or other suitable dielectric material. A plurality of contacts 235 are formed in direct physical contact with the gate 230 and directly over the plurality of fins 220, and may traverse the dielectric layer 227. Contacts 235 may be tungsten, aluminum, copper, any other suitable conductor, or any combination thereof. A subset of the plurality of fins 220 are associated with each of the plurality of contacts 235. In the embodiment shown herein, groups of four fins are associated with each contact, hence the fins per contact parameter is four in this example. An example of a group of such groups is shown as reference number 245. In some embodiments, a fins per contact parameter ranges from 5 fins to 20 fins. The metallization line 240 is be disposed over, and in electrical contact with, the plurality of contacts 235. Metallization line 240 may be copper, tungsten, aluminum, another other suitable conductor, or any combination thereof. Gate 230 comprises a length L1. In some embodiments, L1 ranges from about 200 nanometers to about 500 nanometers. To implement the transistor, additional contacts are used to access the source and drain (not shown).

Figure 3:
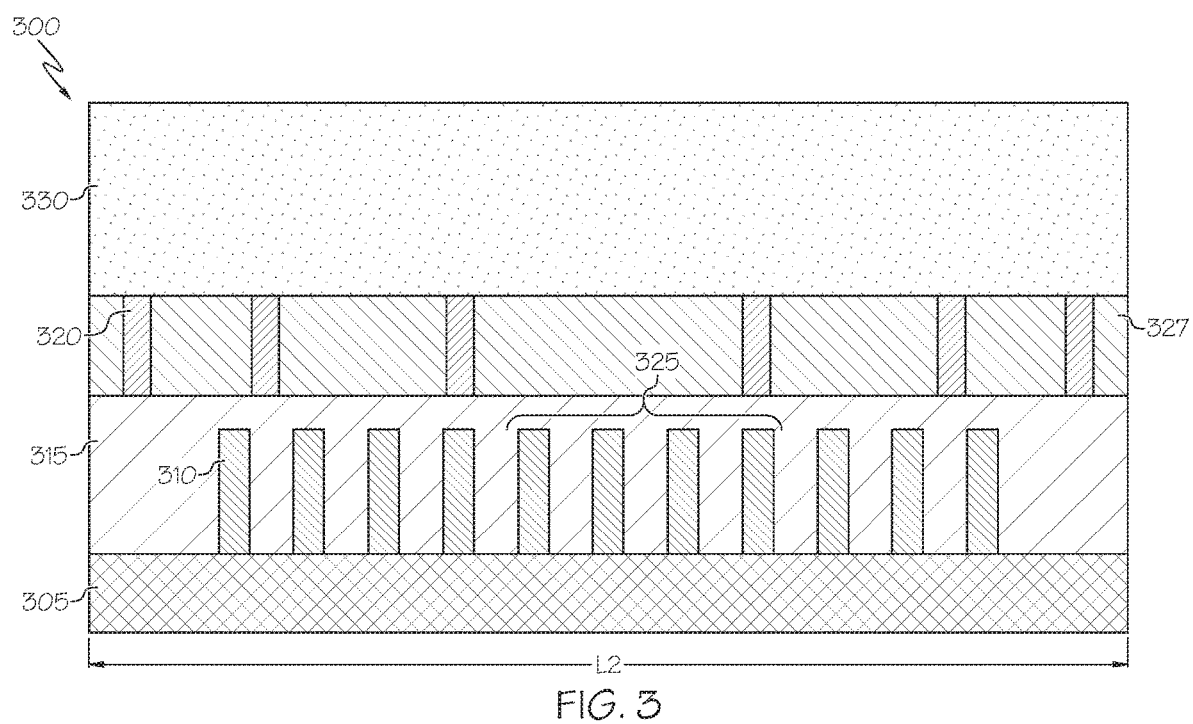
FIG. 3 shows a cross-sectional view of a semiconductor structure in accordance with alternative embodiments of the present invention.

FIG. 3 shows a cross-sectional view of a semiconductor structure in accordance with alternative embodiments of the present invention. Semiconductor structure 300 comprises a semiconductor substrate 305, which may be a bulk semiconductor substrate. A plurality of fins 310 is formed in the semiconductor substrate 305. A gate 315 is disposed over the plurality of fins 310. A dielectric layer 327 is disposed between the gate 315 and a metallization line 330. In embodiments, the dielectric layer may comprise silicon oxide, SiOC, SiCON, or other suitable dielectric material. In some embodiments, the plurality of fins 310 comprises between 40 fins and 100 fins. In some embodiments, more or fewer fins may be included without departing from the scope of the invention. A plurality of contacts 320 are in direct physical contact with the gate 315 and directly over the plurality of fins 310, and may traverse the dielectric layer 327. Contacts 320 may be tungsten, aluminum, copper, any other suitable conductor, or any combination thereof. In some embodiments, the number of fins per contact ranges from 5 fins to 20 fins. In the embodiment shown herein, groups of four fins are associated with each contact. An example of a group of such groups is shown as reference number 325. The metallization line 330 is disposed over, and in electrical contact with, the plurality of contacts 325. Metallization line 330 may be copper, tungsten, aluminum, any other suitable conductor, or any combination thereof. Gate 315 comprises a length L2. In some embodiments, L2 ranges from about 200 nanometers to about 500 nanometers. In some embodiments, the contacts 320 may be formed at regular intervals, connecting the gate 315 to the metallization line 330 to prevent large voltage drops from forming along gate 315.

In embodiments, the contacts (e.g., 125 of FIG. 1, 235 of FIG. 2, and 320 of FIG. 3) may be formed utilizing a process with two different capping layers. The two different capping layers are comprised of different materials and are selectively etchable to each other. In embodiments, one capping layer may be comprised of an oxide, such as silicon oxide, while the other capping layer is comprised of a nitride, such as silicon nitride. One capping layer is used for gate coverage while the other capping layer is used for source/drain access coverage. Selective etch processes open the desired gates at various locations, while block masks are used to cover elements that are not part of the connection scheme.

The contact material is then deposited, making contact with the gates to enable a parallel electrical connection between the gate (e.g., 120 of FIG. 1, 220 of FIG. 2, and 315 of FIG. 3) and the metallization line above it (e.g., 240 of FIG. 2, and 330 of FIG. 3). This particular scheme enables forming contacts to gate and contacts to source/drain regions over active silicon area.

As can now be appreciated, embodiments of the present invention provide an improved field effect transistor with reduced voltage drop along the gate. This facilitates using a single, larger transistor in place of several smaller transistors, resulting in an overall space savings, allowing for increased circuit density. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method, comprising:
    forming a semiconductor substrate;
    forming a plurality of fins formed in the semiconductor substrate, wherein each fin of the plurality of fins has a longer extent in a first horizontal direction and a shorter extent in a second horizontal direction perpendicular to the first horizontal direction;
    forming a gate disposed over the plurality of fins and in direct physical contact with each fin of the plurality of fins, wherein the gate has a gate extent in the second horizontal direction that is greater than a total extent of the plurality of fins in the second horizontal direction;
    forming a plurality of contacts in direct physical contact with the gate, wherein at least one contact is over one fin of the plurality of fins and not over any portion of the semiconductor substrate between any two adjacent fins; and
    forming a metallization line disposed over the plurality of contacts and over the entire gate, wherein the metallization line is in electrical contact with the plurality of contacts and the metallization line has a metallization line extent in the second horizontal direction that is greater than or equal to the gate extent in the second horizontal direction.

2. The method of claim 1, wherein forming the plurality of fins comprises forming from 20 fins to 30 fins.

3. The method of claim 1, wherein forming the plurality of fins comprises forming from 31 fins to 60 fins.

4. The method of claim 1, wherein forming the plurality of fins comprises forming from 61 fins to 200 fins.

5. The method of claim 1, wherein forming the plurality of fins comprises forming the plurality of fins from silicon.

6. The method of claim 1, wherein forming the plurality of fins comprises forming the plurality of fins from silicon germanium.

7. The method of claim 1, further comprising forming a dielectric layer disposed between the metallization line and the gate.

8. The method of claim 7, wherein forming the dielectric layer comprises forming the dielectric layer from silicon oxide.

9. The method of claim 1, wherein forming the metallization line comprises forming the metallization line from copper.

10. The method of claim 1, wherein forming the plurality of contacts comprises forming the plurality of contacts from tungsten.

11. The method of claim 1, further comprising forming a fin merge semiconductor region.

12. The method of claim 11, wherein forming the fin merge semiconductor region comprises forming the fin merge semiconductor region from silicon.

13. The method of claim 11, wherein forming the fin merge semiconductor region comprises forming the fin merge semiconductor region from silicon germanium.

14. A method comprising:
    forming a plurality of In-Out (TO) circuits, wherein forming each IO circuit comprises forming at least one finFET device, wherein forming the at least one finFET device comprises:
    forming a plurality of fins, wherein each fin of the plurality of fins has a longer extent in a first horizontal direction and a shorter extent in a second horizontal direction perpendicular to the first horizontal direction,
    forming a gate disposed over the plurality of fins and in direct physical contact with each fin of the plurality of fins, wherein the gate has a gate extent in the second horizontal direction that is greater than a total extent of the plurality of fins in the second horizontal direction and the gate has a length/width aspect ratio ranging from 16 to 60,
    forming a plurality of contacts in direct physical contact with the gate, wherein at least one contact is over one fin of the plurality of fins and not over any portion of the semiconductor substrate between any two adjacent fins,
    forming a metallization line disposed above, and in line with, the gate, wherein the metallization line has a resistance value less than a resistance value of the gate and the metallization line has a metallization line extent in the second horizontal direction that is greater than or equal to the gate extent in the second horizontal direction.

15. The method of claim 14, wherein forming the plurality of contacts comprises spacing the plurality of contacts at regular intervals.

16. A method, comprising:
    forming a semiconductor substrate;
    forming a plurality of fins formed in the semiconductor substrate, wherein each fin of the plurality of fins has a longer extent in a first horizontal direction and a shorter extent in a second horizontal direction perpendicular to the first horizontal direction;
    forming a gate disposed over the plurality of fins and in direct physical contact with each fin of the plurality of fins, wherein the gate has a gate extent in the second horizontal direction that is greater than a total extent of the plurality of fins in the second horizontal direction, wherein the plurality of fins comprises between 40 fins and 100 fins;

forming a plurality of contacts in direct physical contact with the gate, wherein at least one contact is over one fin of the plurality of fins and not over any portion of the semiconductor substrate between any two adjacent fins, and a fins per contact parameter ranges from 5 fins to 20 fins; and forming a metallization line disposed over the plurality of contacts and over the entire gate, wherein the metallization line is in electrical contact with the plurality of contacts and the metallization line has a metallization line extent in the second horizontal direction that is greater than or equal to the gate extent in the second horizontal direction.

17. The method of claim 16, wherein forming the metallization line comprises forming the metallization line from copper.

18. The method of claim 17, wherein forming the plurality of contacts comprises forming the plurality of contacts from tungsten.

19. The method of claim 18, further comprising forming a dielectric layer disposed between the metallization line and the gate.

* * * * *